United States Patent
Cheng et al.

(10) Patent No.: US 11,282,869 B2
(45) Date of Patent: Mar. 22, 2022

(54) DISPLAY PANEL AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Jinhui Cheng, Beijing (CN); Wei Zhang, Beijing (CN); Zhankun Meng, Beijing (CN); Neng He, Beijing (CN); Xuecheng Huo, Beijing (CN); Hengyu Yan, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/837,720

(22) Filed: Apr. 1, 2020

(65) Prior Publication Data
US 2021/0098505 A1   Apr. 1, 2021

(30) Foreign Application Priority Data
Sep. 26, 2019  (CN) .......................... 201910918063.8

(51) Int. Cl.
*H01L 27/12* (2006.01)
(52) U.S. Cl.
CPC ................. *H01L 27/1244* (2013.01)
(58) Field of Classification Search
None
See application file for complete search history.

(56) References Cited

U.S. PATENT DOCUMENTS

| 10,700,096 | B2 | 6/2020 | Huang et al. | |
| 10,727,125 | B2 | 7/2020 | Zhang et al. | |
| 2016/0190179 | A1* | 6/2016 | Kim | H01L 27/1244 |
| | | | | 257/774 |
| 2019/0080962 | A1 | 3/2019 | Zhang et al. | |
| 2019/0189640 | A1 | 6/2019 | Huang et al. | |
| 2020/0098795 | A1* | 3/2020 | Jung | H01L 23/528 |

FOREIGN PATENT DOCUMENTS

| CN | 105158996 A | 12/2015 |
| CN | 106200159 A | 12/2016 |
| CN | 106647070 A | 5/2017 |
| CN | 106997882 A | 8/2017 |
| CN | 107894681 A | 4/2018 |
| CN | 108153070 A | 6/2018 |
| CN | 208110199 U | 11/2018 |
| CN | 109521610 A | 3/2019 |
| JP | 6347946 B2 | 6/2018 |

OTHER PUBLICATIONS

First Office Action, including search report, for Chinese Patent Application No. 201910918063.8, dated Dec. 31, 2020, 12 pages.

* cited by examiner

*Primary Examiner* — Steven M Christopher
(74) *Attorney, Agent, or Firm* — Westman, Champlin & Koehler, P.A.

(57) ABSTRACT

The preset disclosure provides a display panel and a display device. The display panel includes: a first substrate; a first bonding electrode which is located on a first surface of the first substrate facing a light-outgoing direction of the display panel and is located at an edge outside a display area of the display panel.

11 Claims, 3 Drawing Sheets

DISPLAY PANEL AND DISPLAY DEVICE

CROSS-REFERENCE TO RELATED APPLICATION

The present application claims the priority of Chinese Patent Application No. 201910918063.8 filed on Sep. 26, 2019, the contents of which are incorporated herein in their entirety by reference.

TECHNICAL FIELD

The present disclosure relates to the field of display technology, and in particular to a display panel and a display device.

BACKGROUND

Currently, the application of narrow-bezels has become an important technical development direction of the display industry, and it is also an important direction for improving product specifications. In the related art, the display panel and the flexible printed circuit board (FPC) are usually bonded at the front edge of the display panel, but this is not conducive to achieving a narrow border.

Therefore, the current related technologies still need to be improved.

SUMMARY

In an aspect of the present disclosure, the present disclosure provides a display panel. According to an embodiment of the present disclosure, the display panel includes: a first substrate; a first bonding electrode which is located on a first surface of the first substrate facing a light-outgoing direction of the display panel and is located at an edge outside a display area of the display panel.

According to an embodiment of the present disclosure, a thickness of the first bonding electrode is greater than or equal to 0.8 microns.

According to an embodiment of the present disclosure, the first bonding electrode includes a first sub-layer and a second sub-layer that are laminated, the first sub-layer is formed in a same layer as a gate of a thin film transistor on the first substrate by a single patterning process, and the second sub-layer is formed in a same layer as a source and a drain of the thin film transistor by a single patterning process.

According to an embodiment of the present disclosure, a thickness of the first sub-layer is greater than or equal to 0.5 microns, and a thickness of the second sub-layer is greater than or equal to 0.3 microns.

According to an embodiment of the present disclosure, a material of the first sub-layer is copper, and a material of the second sub-layer is aluminum or copper.

According to an embodiment of the present disclosure, the display panel further includes: a second bonding electrode which is located on a side surface of the first bonding electrode which faces directly away from the display area of the display panel, and is electrically connected to the first bonding electrode.

According to an embodiment of the present disclosure, a roughness Ra of a surface of the first bonding electrode that is in contact with the second bonding electrode is less than 3 microns.

According to an embodiment of the present disclosure, the surface of the first bonding electrode that is in contact with the second bonding electrode is treated by at least one of a Y-direction grinding treatment and a Z-direction grinding treatment.

According to an embodiment of the present disclosure, the second bonding electrode satisfies at least one of following conditions: the second bonding electrode is a silver electrode; and a thickness of the second bonding electrode is 1 to 3 microns.

According to an embodiment of the present disclosure, the display panel further includes a protection layer which is disposed on a surface of the first bonding electrode which faces directly away from the first substrate.

According to an embodiment of the present disclosure, the protection layer satisfies at least one of following conditions: the protection layer is an organic film layer; and a thickness of the protection layer is greater than or equal to 2 microns and less than or equal to 5 microns.

In another aspect of the present disclosure, the present disclosure provides a display device. According to an embodiment of the present disclosure, the display device includes the above display panel.

DETAILED DESCRIPTION

The embodiments of the present disclosure may be described hereinafter in details. The embodiments described below are exemplary and are only used to explain the present disclosure, and should not be construed as limiting the present disclosure. Those from the embodiments that do not indicate a specific technology or condition are performed according to the technology or conditions described in the literature in the art or according to the product specification. All reagents or instruments used without specifying their manufacturers are conventional products that are commercially available.

Figure 1:
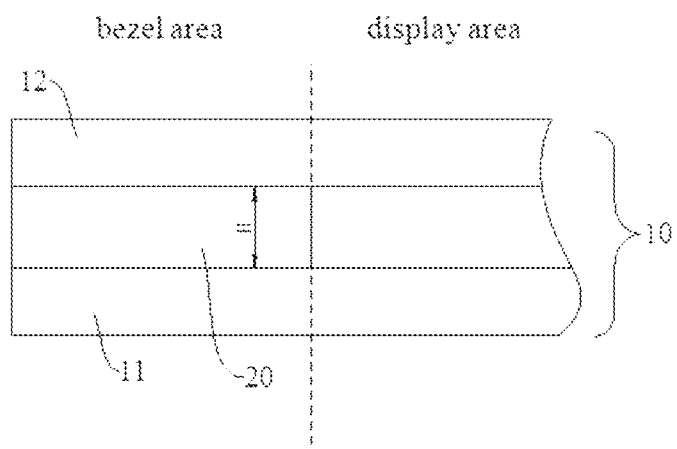
FIG. 1 is a structural diagram of a cross-section of a display panel according to an embodiment of the present disclosure.

In an aspect of the present disclosure, the present disclosure provides a display panel. According to an embodiment of the present disclosure, referring to FIG. 1, the display panel includes: a first substrate 11; a first bonding electrode 20 which is located on a first surface of the first substrate 11 facing a light-outgoing direction of the display panel and is located at an edge outside a display area of the display panel. In the display panel, by providing the first bonding electrode with a sufficient thickness at the edge position, it can be electrically connected to components such as FPC through the side surface of the first bonding electrode, which can greatly reduce the width of the bezel and achieve the effect of narrow bezel.

According to an embodiment of the present disclosure, the specific type and structure of the display panel are not particularly limited, and may be any known display panel and structure, such as a liquid crystal display panel, an OLED display panel, a QLED display panel, and the like. The component structure may also the structure for a conventional display panel. For example, a liquid crystal display panel may include a first substrate and a second substrate opposite to each other, a liquid crystal layer disposed between the first substrate and the second substrate, and thin film transistors (TFTs), electrodes, circuit structures, filters, etc. on the first and second substrates; and OLED and QLED display panels may include display substrates, and TFTs, light-emitting devices, etc. disposed on the display substrate. A substrate or a packaging film may be disposed on a side of the light-emitting devices which faces directly away from the display substrate, which is not described in detail here.

According to an embodiment of the present disclosure, a thickness H of the first bonding electrode 20 may be greater than or equal to 0.8 microns (for example, 0.8 microns, 0.9 microns, 1 micron, 1.1 microns, 1.2 microns, 1.3 microns, 1.4 microns, 1.5 microns, etc.). Therefore, a thickness greater than or equal to 0.8 microns obtains a larger bonding area, which can further improve the adhesion of side bonding, effectively ensure that the components connected to the side surface will not fall off, and thus further improve the yield while effectively improving reliability and stability.

Figure 2:
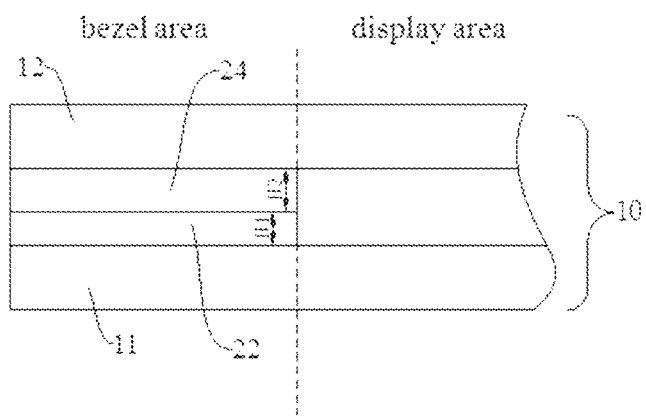
FIG. 2 is a structural diagram of a cross-section of a display panel according to another embodiment of the present disclosure.

According to an embodiment of the present disclosure, the first bonding electrode 20 may be a single-layer structure or a multi-layer structure, as long as the thickness satisfies the requirement of the bonding force. In some specific embodiments, referring to FIG. 2, the first bonding electrode 20 includes a first sub-layer 22 and a second sub-layer 24 that are laminated, the first sub-layer 22 is formed in a same layer as a gate of a thin film transistor on the first substrate 11 through a single patterning process, and the second sub-layer 24 is formed in a same layer as a source and a drain of the thin film transistor through a single patterning process. Therefore, the first bonding electrode is compatible with the manufacturing process in the related art. The first bonding electrode can be simultaneously formed while preparing the thin film transistor, without additional devices and preparation steps, and the operation is simple and easy to implement.

It should be noted that, taking the first sub-layer and the gate as an example, the description "formed by a single patterning process" here means that a whole conductive layer is formed first, and then the whole conductive layer is patterned through photolithography (photoresist coating, exposure, development, and etching), and the first sub-layer and the gate are obtained after patterning. The meanings of other similar descriptions are the same, and will not be repeated here.

According to an embodiment of the present disclosure, the thicknesses of the first sub-layer and the second sub-layer may be selected according to requirements of the gate, the source and the drain, and the thickness of the first bonding electrode. In some specific embodiments, a thickness $H_1$ of the first sub-layer is greater than or equal to 0.5 microns, and a thickness $H_2$ of the second sub-layer is greater than or equal to 0.3 microns. Within such thickness ranges, they can be matched with and be prepared simultaneously with the gate, source, and drain, and the bonding force of side bonding can be guaranteed to avoid the risk of falling off.

According to an embodiment of the present disclosure, the material of the first bonding electrode may be a material with better conductivity. Specifically, the material may be a metal material. In some specific embodiments, the material of the first sub-layer may be copper. The material of the second sub-layer may be aluminum or copper. Therefore, while having good conductivity, it can be made of the same material as the gate and source/drain in the thin film transistor, and can be obtained through a one-step process.

Figure 3:
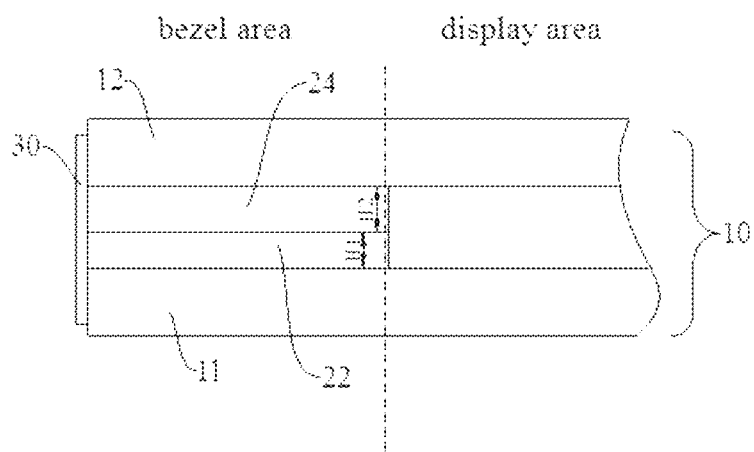
FIG. 3 is a structural diagram of a cross-section of a display panel according to another embodiment of the present disclosure.

According to an embodiment of the present disclosure, when performing side bonding, a component (such as FPC) that needs to be connected to the display panel may be directly connected to the first bonding electrode, or a connection electrode may be provided on the side surface of the first bonding electrode. The connection electrode connects the first bonding electrode and the component that needs to be electrically connected to the display panel. In some specific embodiments, referring to FIG. 3, the display panel further includes a second bonding electrode 30, which is located on a side surface of the first bonding electrode 20 which faces directly away from the display area of the display panel, and is electrically connected to the first bonding electrode 20. As shown in FIG. 3, by further providing the second bonding electrode 30 on a side surface of the first bonding electrode 20 which faces directly away from the display area (that is, the side surface of the first bonding electrode 20 facing the side of the display panel bezel), it is possible to more reliably connect the display panel to, for example, the FPC part.

Figure 9:
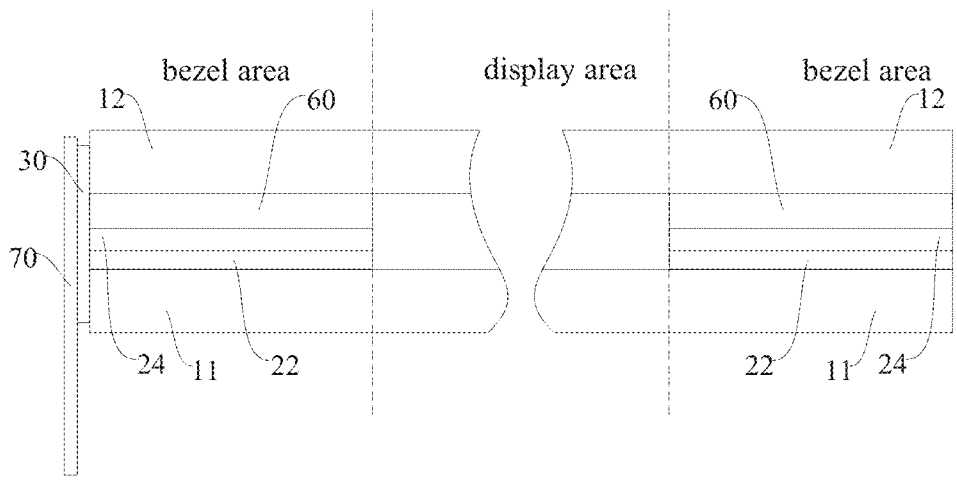
FIG. 9 is a structural diagram of a cross-section of a display panel according to another embodiment of the present disclosure.

It will be appreciated that, referring to FIG. 9, the component 70 that needs to be connected to the display panel may be bonded to the second bonding electrode 30 to achieve the connection. Therefore, a better side bonding can be achieved, the bonding force is stronger, and a better effect of narrow bezel can be achieved.

According to an embodiment of the present disclosure, in order to further enhance the bonding force between the first bonding electrode and the second bonding electrode, the surface of the first bonding electrode that is in contact with the second bonding electrode may be grinded, so that a roughness Ra of the surface of the first bonding electrode that is in contact with the second bonding electrode is less than 3 microns. As a result, lead chipping on the side surface of the first bonding electrode can be eliminated. Such surface morphology can make the bonding force stronger, and the reliability and stability of the side bonding better.

Figure 4:
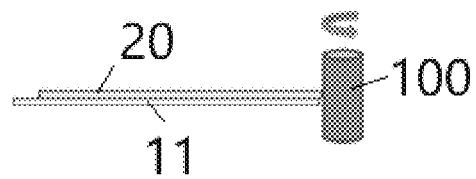
FIG. 4 is a structural diagram of a Y-direction grinding according to an embodiment of the present disclosure.
Figure 5:
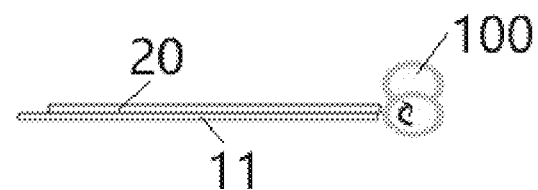
FIG. 5 is a structural diagram of a Z-direction grinding according to an embodiment of the present disclosure.

Specifically, the specific grinding treatment method is not particularly limited, as long as the surface roughness satisfies the above requirements. In some specific embodiments, a Y-direction grinding (referring to FIG. 4, the arrow as shown indicates the rotation direction of the cutter wheel) or a Z-direction grinding (referring to FIG. 5, the arrow as shown indicates the rotation direction of the cutter wheel) may be used. Specifically, during grinding, the cutter wheel 100 rotates around its axial direction. The Y-direction grinding means that the axis of the cutter wheel is perpendicular to the display panel, and the Z-direction grinding means that the axis of the cutter wheel is parallel to the display panel. In some specific embodiments, the surface of the first bonding electrode that is in contact with the second bonding electrode may be grinded by the Y-direction grinding. As a result, the roughness of the side surface of the first bonding electrode is improved after grinding, and the bonding force is greater.

According to an embodiment of the present disclosure, the material of the second bonding electrode may be selected from materials with good conductivity and strong adhesion. In some specific embodiments, the second bonding electrode may be a silver electrode; specifically, it may be formed by curing the silver glue, and the cured silver electrode is brought into full contact with the first bonding electrode to minimize the contact resistance. Specifically, the thickness of the second bonding electrode may be 1 to 3 microns. Therefore, it can not only ensure better conductivity and smaller resistance, but also have stronger bonding force and better reliability and stability.

Figure 6:
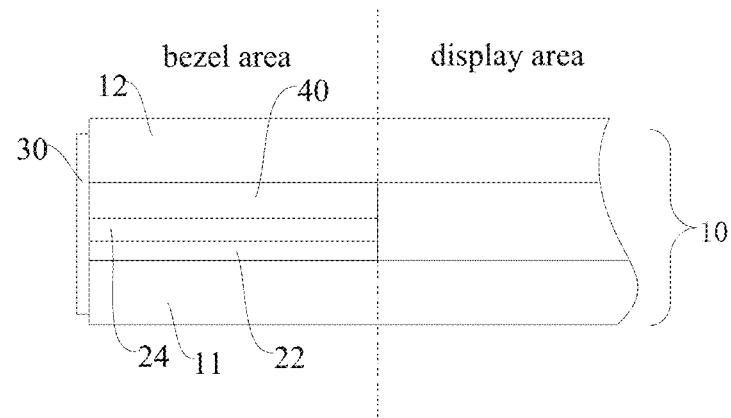
FIG. 6 is a structural diagram of a cross-section of a display panel according to another embodiment of the present disclosure.

According to an embodiment of the present disclosure, referring to FIG. 6, the display panel may further include a protection layer 40 disposed on a surface of the first bonding electrode 20 which faces directly away from the first substrate 11. Thereby, the first bonding electrode can be protected from being oxidized while the second substrate 12 can be supported.

According to an embodiment of the present disclosure, the material of the protection layer may be an organic film layer, and may specifically be a photoresist, such as a photoresist made of an organic material (e.g. PC760, Japan) and the like. As a result, materials are widely available and easy to handle. The thickness of the protection layer may be greater than or equal to 2 microns and less than or equal to 5 microns. Within this thickness range, it can ensure better protection and support while cooperating with other structural members of the display panel, and it will not be too thick.

Figure 7:
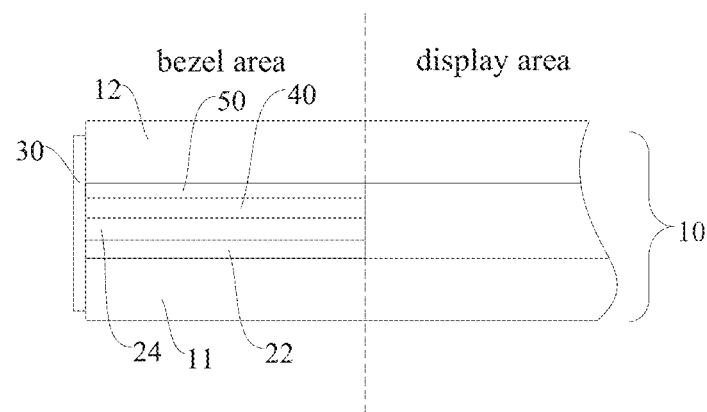
FIG. 7 is a structural diagram of a cross-section of a display panel according to another embodiment of the present disclosure.
Figure 8:
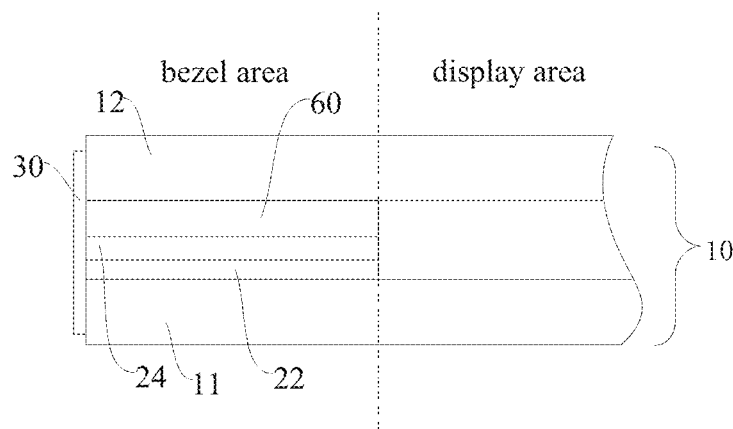
FIG. 8 is a structural diagram of a cross-section of a display panel according to another embodiment of the present disclosure.

It will be appreciated that the display panel may further include a second substrate 12 which may be disposed in contact with the protection layer 40 (referring to FIG. 6); in some embodiments, a gap 50 may be provided between the second substrate 12 and the protection layer 40 (referring to FIG. 7); in other embodiments, the protection layer may not be provided, and in this case, a gap 60 is provided between the first bonding electrode and the second substrate 12 (referring to FIG. 8).

In another aspect of the present disclosure, the present disclosure provides a display device. According to an embodiment of the present disclosure, the display device includes the above display panel. The display device can achieve the effect of narrow bezel.

According to the embodiments of the present disclosure, the specific type of the display device is not particularly limited, and any known display device, for example, mobile phones, televisions, game consoles, tablets, wearable devices, etc., may be used. It will be appreciated that, in addition to the aforementioned display panel, the display device may include structures and components necessary for a conventional display device. Taking a mobile phone as an example, it may also include a touch screen, a fingerprint recognition module, a sound processing system, a casing, a motherboard, a memory, and so on, which will not be described in detail here.

In the description of the present disclosure, it should be understood that the terms "first" and "second" are used for descriptive purposes only, and cannot be understood as indicating or suggesting relative importance or implicitly indicating the number of technical features indicated. Therefore, the features defined as "first" and "second" may explicitly or implicitly include one or more of the features.

In the description of the present disclosure, the meaning of "a plurality" is two or more, unless specifically defined otherwise.

In the description of this specification, the description with reference to the terms "an embodiment", "some embodiments", "examples", "specific examples", or "some examples" and the like means that specific features, structures, materials, or characteristics described in conjunction with the embodiment(s) or example(s) are included in at least one embodiment or example of the present disclosure. In this specification, the schematic expressions of the above terms are not necessarily directed to the same embodiment or example. Moreover, the particular features, structures, materials, or characteristics as described may be combined in any suitable manner in any one or more embodiments or examples. In addition, without any contradiction, those skilled in the art may combine different embodiments or examples and features of the different embodiments or examples described in this specification.

Although the embodiments of the present disclosure have been shown and described above, it will be appreciated that the above embodiments are exemplary and should not be construed as limitations on the present disclosure. Those skilled in the art can make changes, modifications, substitutions, and modifications to the above embodiments within the scope of the present disclosure.

What is claimed is:

1. A display panel, comprising:
   a first substrate;
   a first bonding electrode which is located on a first surface of the first substrate facing a light-outgoing direction of the display panel and is located at an edge outside a display area of the display panel; and
   a second bonding electrode which is located on a side surface of the first bonding electrode which faces directly away from the display area of the display panel, and is electrically connected to the first bonding electrode.

2. The display panel according to claim 1, wherein a thickness of the first bonding electrode is greater than or equal to 0.8 microns.

3. The display panel according to claim 1, wherein the first bonding electrode comprises a first sub-layer and a second sub-layer that are laminated, the first sub-layer is formed in a same layer as a gate of a thin film transistor on the first substrate by a single patterning process, and the second sub-layer is formed in a same layer as a source and a drain of the thin film transistor by a single patterning process.

4. The display panel according to claim 3, wherein a thickness of the first sub-layer is greater than or equal to 0.5 microns, a thickness of the second sub-layer is greater than or equal to 0.3 microns.

5. The display panel according to claim 3, wherein a material of the first sub-layer is copper, and a material of the second sub-layer is aluminum or copper.

6. The display panel according to claim 1, wherein a roughness Ra of a surface of the first bonding electrode that is in contact with the second bonding electrode is less than 3 microns.

7. The display panel according to claim 6, wherein the surface of the first bonding electrode that is in contact with the second bonding electrode is treated by at least one of a Y-direction grinding treatment and a Z-direction grinding treatment.

8. The display panel according to claim 1, wherein the second bonding electrode satisfies at least one of following conditions:
 the second bonding electrode is a silver electrode; and
 a thickness of the second bonding electrode ranges from 1 to 3 microns.

9. The display panel according to claim 1, wherein the display panel further comprises a protection layer disposed on a surface of the first bonding electrode which faces directly away from the first substrate.

10. The display panel according to claim 9, wherein the protection layer satisfies at least one of following conditions:
 the protection layer is an organic film layer; and
 a thickness of the protection layer is greater than or equal to 2 microns and less than or equal to 5 microns.

11. A display device comprising the display panel according to claim 1.

* * * * *